(12) United States Patent
Neaves

(10) Patent No.: US 7,612,816 B2
(45) Date of Patent: Nov. 3, 2009

(54) LOW POWER COMPARATOR

(75) Inventor: Philip Neaves, Surrey (GB)

(73) Assignee: Micron Technology, Inc., Boise, ID (US)

( * ) Notice: Subject to any disclaimer, the term of this patent is extended or adjusted under 35 U.S.C. 154(b) by 952 days.

(21) Appl. No.: 10/854,775

(22) Filed: May 26, 2004

(65) Prior Publication Data

US 2005/0179470 A1 Aug. 18, 2005

(30) Foreign Application Priority Data

Feb. 12, 2004 (GB) ................................ 0403138.1

(51) Int. Cl.
| | |
|---|---|
| H04N 3/14 | (2006.01) |
| H04N 5/335 | (2006.01) |
| H03M 1/38 | (2006.01) |
| H03M 1/34 | (2006.01) |

(52) U.S. Cl. .................. 348/302; 348/294; 341/161; 341/164; 341/165

(58) Field of Classification Search ......... 341/158–170; 327/77–79, 97, 20; 348/302–304
See application file for complete search history.

(56) References Cited

U.S. PATENT DOCUMENTS

| | | | | |
|---|---|---|---|---|
| 4,431,916 A | * | 2/1984 | Couch | 250/214 R |
| 5,245,526 A | * | 9/1993 | Balakrishnan et al. | 363/97 |
| 5,736,953 A | | 4/1998 | Yamaguchi | 341/163 |
| 6,137,432 A | * | 10/2000 | Xiao | 341/169 |
| 6,147,517 A | * | 11/2000 | AlNahas et al. | 327/65 |
| 6,151,328 A | * | 11/2000 | Kwon et al. | 370/441 |
| 6,229,133 B1 | * | 5/2001 | Hynecek | 250/208.1 |
| 6,370,339 B1 | * | 4/2002 | Stern et al. | 396/429 |
| 6,480,134 B1 | | 11/2002 | Sasaki | 341/159 |
| 6,583,817 B1 | * | 6/2003 | Lee | 348/241 |
| 6,784,810 B2 | * | 8/2004 | Falik et al. | 341/26 |
| 6,788,237 B1 | * | 9/2004 | Bidermann et al. | 341/155 |
| 7,030,668 B1 | * | 4/2006 | Edwards | 327/143 |
| 2003/0133627 A1 | * | 7/2003 | Brehmer et al. | 382/308 |
| 2004/0052184 A1 | * | 3/2004 | Liao et al. | 369/53.26 |
| 2004/0174206 A1 | * | 9/2004 | Matsumura | 327/541 |
| 2004/0252036 A1 | * | 12/2004 | Nitzpon et al. | 341/61 |

OTHER PUBLICATIONS

Krymski, Alex , et al., "A 2 e- Noise 1.3 Megapixel CMOS Sensor", *2003 IEEE Workshop on CCDs & Advanced Image Sensors*, Elmau, Germany, ( May 15-17, 2003).

* cited by examiner

*Primary Examiner*—Jason Chan
*Assistant Examiner*—Pritham Prabhakher
(74) *Attorney, Agent, or Firm*—Schwegman, Lundberg & Woessner, P.A.

(57) ABSTRACT

A comparator with an input stage that selectively powers up an output stage provides an electronic device with a comparator that operates at low power. In an embodiment, an input stage produces a near decision and a true decision, where the near decision is provided to power up an output stage for the comparator to provide an output representative of the true decision.

74 Claims, 6 Drawing Sheets

LOW POWER COMPARATOR

CLAIM OF PRIORITY

This application claims priority under 35 U.S.C. 119 from British Application No. 0403138.1 filed Feb. 12, 2004, which application is incorporated herein by reference.

This application relates generally to electronic devices having a comparator, in particular, to electronic devices employing many slope (ramp) analog to digital converters each having a comparator.

BACKGROUND

In electronic devices and systems that use a large number of slope (ramp) analog to digital converters (ADCs) on a single chip, or die, power consumption by comparators associated with the analog to digital converters can be significant. FIG. 1 illustrates a typical imaging array 10 with a single ADC per column. For operation of the imaging array, a row of pixels is selected and an appropriate voltage on each column is sampled by the sample and hold units 15-1 . . . 15-M. A ramp generator 20 is started. Each column has a comparator 25-1 . . . 25-M that toggles when its sampled voltage is equal to the voltage of ramp generator 20. Such an architecture uses a large number of sample and hold units and comparators. For example, in CMOS imaging applications, a million pixel device is not uncommon. In a typical architecture, a million pixel device could require 1000 comparators for a 1000×1000 pixel topology. Such a large number of comparators places two conflicting design constraints on the comparator design: low power operation and high speed operation. In addition to low power consumption, high speed operation is desired since each comparator must switch within one clock cycle of a digital ramp generator clock. If the comparator switches too late, the incorrect value of the ramp generator will be latched, which will resemble an unwanted offset.

DETAILED DESCRIPTION

The following detailed description refers to the accompanying drawings that show, by way of illustration, specific aspects and embodiments in which the present invention may be practiced. These embodiments are described in sufficient detail to enable those skilled in the art to practice the present invention. Other embodiments may be utilized and structural, logical, and electrical changes may be made without departing from the scope of the present invention. The various embodiments disclosed herein are not necessarily mutually exclusive, as some disclosed embodiments can be combined with one or more other disclosed embodiments to form new embodiments.

In an embodiment, an electronic device includes a comparator having an input stage to produce a near decision and a true decision, where the near decision is provided to power up a switching output stage for the comparator to provide an output representative of the true decision. With a ramping reference voltage for the input stage, the output stage can be configured to be powered up only a fraction of the ramp time of the reference voltage, reducing the power consumption of the output stage. In an embodiment, the electronic device is an imaging device having an array of pixels, where each column of the array is associated with a comparator having an input stage to produce a near decision and a true decision, with the near decision provided to power up a switching output stage of the comparator to provide an output representative of the true decision.

In an embodiment, a comparator has an input stage that provides a true decision and a near decision. The near decision is used to enable an output stage to power on to provide a representation of the true decision. A near decision is provided when a reference signal approaches a given input signal, and a true decision is provided when the reference signal substantially equals the given input signal. The output stage provides a representation of the true decision. This representation may be a signal corresponding to the true decision or a signal inverted from the signal corresponding to the true decision. Such an input stage provides for lowered power consumption while still maintaining a high speed of operation. Using a ramp signal as an input reference to the input stage provides a comparator that functions as a slope analog to digital converter (ADC), or ramp ADC. In an embodiment, an input signal is sampled and provided to a comparator along with a ramp signal from a ramp generator. When the input signal is the same as the ramp signal the output of the comparator will flip to latch a count value of the ramp generator to define the converted value. A single slope ADC uses a single ramp signal, while a dual slope ADC uses two ramp signals such as a ramping up signal and ramping down signal.

Figure 1:
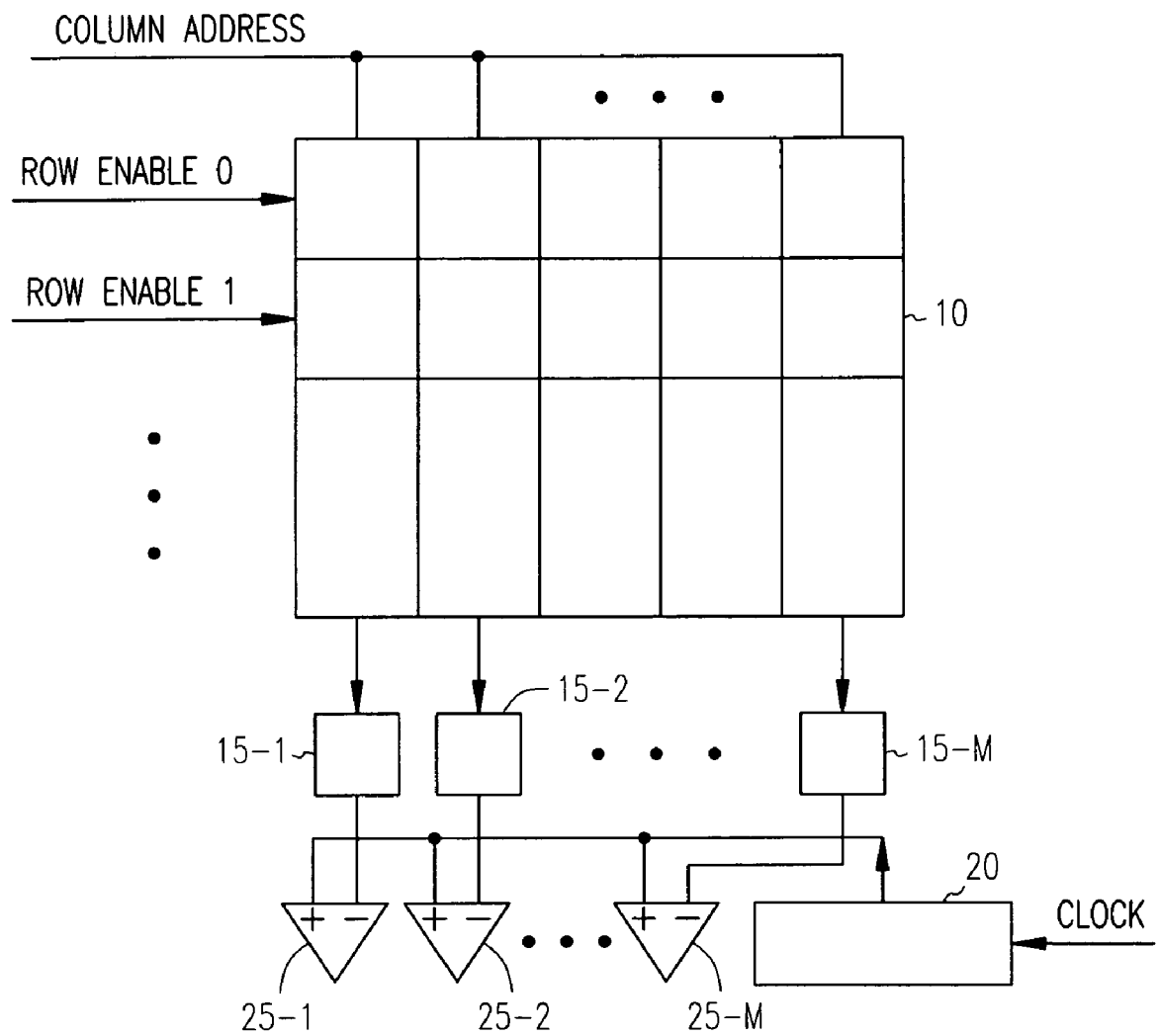
FIG. 1 illustrates a typical imaging array with a single ADC per column.
Figure 2:
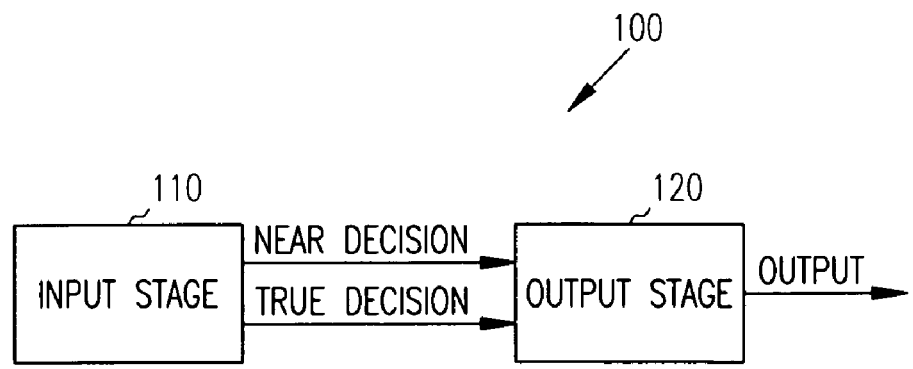
FIG. 2 depicts an embodiment of an electronic device including a comparator having an input stage to produce a near decision and a true decision, according to the teachings of the present invention.

FIG. 2 depicts an embodiment of an electronic device 100 including a comparator having an input stage 110 to produce a near decision and a true decision. The near decision is provided to power up a switching output stage 120 for the comparator to provide an output representative of the true decision. Input stage 110 may include a circuit to provide an offset voltage such that the near decision is produced prior to producing the true decision relative to a ramping reference voltage. In an embodiment switching output stage 120 has an enable input responsive to a voltage representative of the near decision. In an embodiment, switching output stage 120 has logic to reset the input stage once a voltage representing the true decision has been processed by the switching output stage. Switching output stage 120 may be configured to be powered up for a fraction of the total ramp time of a ramping reference voltage provided to input stage 110. In an embodiment, switching output stage 120 may be configured to be powered up for about 10% to about 50% of a total ramp time of a ramping reference voltage provided to input stage 110. Electronic device 100 may be realized as a system or may be configured as a single chip.

In an embodiment, a comparator configured to function as in FIG. 2 provides an output that is a comparison of an input to a ramping reference signal in which the output of the comparator is configured to flip, or switch, when the ramping reference signal is substantially equal to the input to the comparator. In embodiments in which a signal that presents the decision of the comparison is amplified or further processed, power consumption can be reduced while providing this further processing to the signal by controlling the on/off status of an output stage that provides the amplification or further processing to this signal. The configuration for the embodiment of FIG. 2 provides such a means for having output stage 120 powered up only to process an output representing a true decision from input stage 110 when the ramping signal substantially equals an input signal to input stage 110. Just before the ramping signal becomes substantially equal to the input signal, input stage 110 outputs a near decision signal, representing a near decision, to enable output stage 120 to be powered up.

Figure 3:
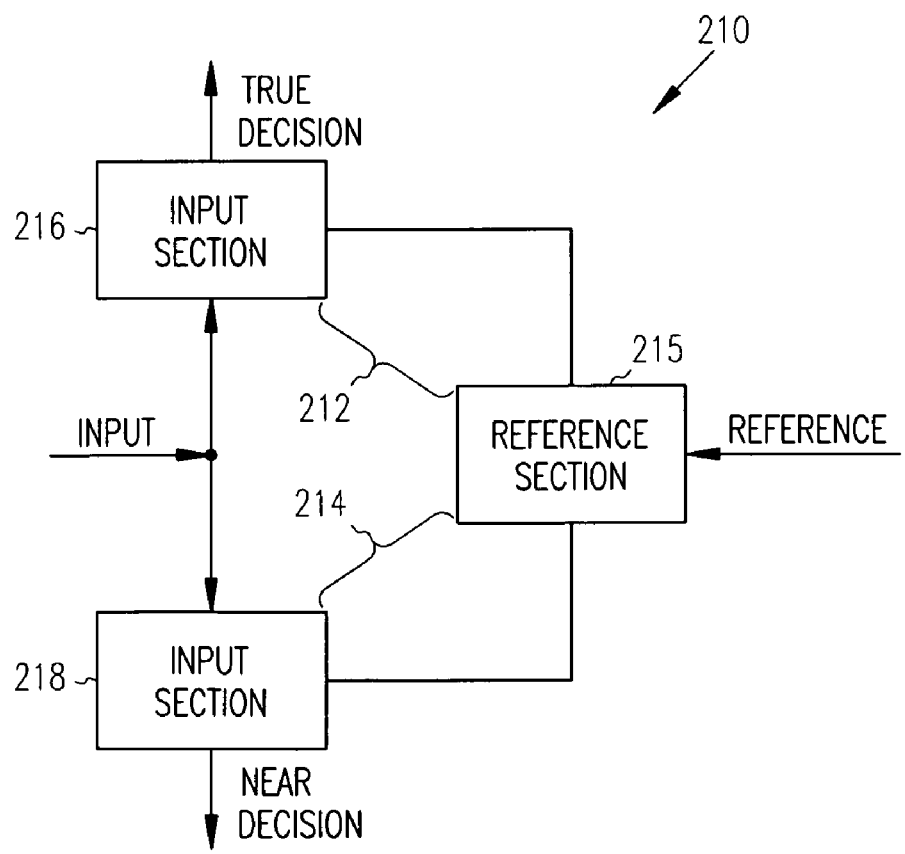
FIG. 3 depicts a block diagram of an embodiment of an input stage of an electronic device, where the input stage has two differential pairs in which each differential pair share a common reference section, according to the teachings of the present invention.

FIG. 3 depicts a block diagram of an embodiment of an input stage 210 of an electronic device, where input stage 210 has two differential pairs 212 and 214, relative to the same input signal and the same reference signal. Each differential pair 212, 214 shares a common reference section 215. Differential pair 212 of input stage 210 includes an input section 216 responsive to an input signal and reference section 215 responsive to a reference signal, where input section 216 is balanced with respect to reference section 215. Differential pair 214 of input stage 210 includes an input section 218 responsive to the input signal and reference section 215, where input section 218 is not balanced with respect to reference section 215. Differential pair 218 provides a near decision and differential pair 216 provides a true decision. The near decision is provided to power up a switching output stage that follows input stage 210 to provide an output representative of the true decision.

The input section and the reference section are balanced when the components of the input stage and the reference stage, when configured similarly, have substantially the same operating parameters. In an embodiment in which the input section and reference section form a differential transistor pair, the input section and the reference section are balanced when the transistors for these sections operate with the same current-voltage characteristics In another embodiment, input sections 216 and 218 are configured similarly except that the components of each input section 216, 218 are unbalanced with respect to the components of the other input section. Additionally in this embodiment, input sections 216, 218 are both unbalanced with respect to the components of common reference section 215. However, the components of sections 216 and 218 are selected relative to the components of common reference section 215 such that the near decision output from input section 218 is provided before the true decision output from input section 216 is provided. The near decision is output when reference signal is near the input signal, while the true decision is output when the reference signal substantially equals the input signal. The amount of time that the near decision is output prior to the true decision depends on the relative sizing of the components for input section 216 and input section 218 with respect to each other and to reference section 215.

In an embodiment the reference signal as shown in FIG. 3 is a ramping voltage, $V_{RAMP}$, for input stage 210 receiving an input voltage, $V_{IN}$, as the input and providing a true decision from input section 216 represented by a voltage, $V_{TRUE}$, such that when $V_{IN}$ substantially equals $V_{RAMP}$, then $V_{TRUE}$ will flip. Input section 218 provides a means for providing an effective offset voltage relative to reference section 215 such that input section 218 provides a near decision as an output voltage, $V_{NEAR}$, just before input section 216 provides the true decision. $V_{NEAR}$ can be used to power on an output section to which the true decision is provided. Alternately, an offset voltage can be applied to reference section 215. If the offset voltage is not zero, such as a negative offset voltage for example, then the comparator will switch early depending on the amount of offset. An amount of offset may be provided such that it will switch slightly before or near to when $V_{RAMP}$ substantially equals $V_{IN}$. In an embodiment, the offset voltage may be introduced as a fixed voltage.

Figure 4:
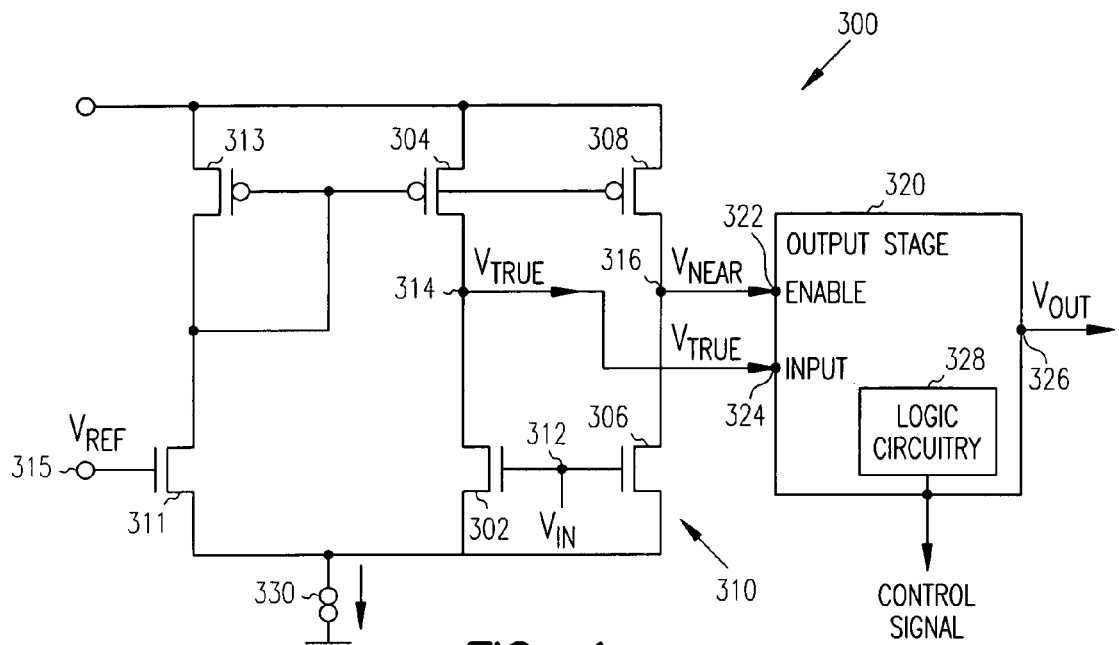
FIG. 4 is a schematic of an embodiment of a circuit for an electronic device having an input stage and output stage, where the input stage includes two differential pairs in which one differential pair provides a signal to enable the output stage to provide an output signal representative of an output signal from the other differential pair, according to the teachings of the present invention.

FIG. 4 is a schematic of an embodiment of a circuit for an electronic device 300 having an input stage 310 and output stage 320. Input stage 310 includes two differential transistor pairs (306, 311) and (302, 311). One differential pair (306, 311) provides an output, $V_{NEAR}$, to enable output stage 320 to provide an output signal, $V_{OUT}$, representative of an output, $V_{TRUE}$, from the other differential pair (302, 311). Differential pair (302, 311) of input stage 310 includes an input 315 for a voltage signal, $V_{REF}$, an input 312 for input signal, $V_{IN}$, and an output 314 for a true signal, $V_{TRUE}$, representative of $V_{IN}$. Differential pair (306, 311) of input stage 310 includes input 315 for voltage signal, $V_{REF}$, input 312 for input signal, $V_{IN}$, and an output 316 for a near true signal, $V_{NEAR}$, providing a signal near to the level of $V_{TRUE}$. In an embodiment, $V_{REF}$ is a ramping reference signal. In an embodiment, output stage 320 is a switching output stage that switches when input voltage, $V_{IN}$, at input 312 and reference voltage, $V_{REF}$, at input 315 are substantially equal.

Input stage 310 provides an input signal, $V_{NEAR}$, to an enable 322 of output stage 320 to power up output stage 320 when a reference signal, $V_{REF}$, is near a desired true output. By providing $V_{NEAR}$ just before $V_{REF}$ reaches the level of an input signal, $V_{IN}$, output stage 320 remains off, until just before $V_{REF}$ substantially equals the input voltage, $V_{IN}$. When $V_{REF}$ reaches a level near $V_{IN}$, input stage 310 outputs $V_{NEAR}$ to power up output 320. Thus, output stage 320 is on only while $V_{REF}$ is at a level near $V_{IN}$, consuming less power than having output stage 320 active for all levels of $V_{REF}$ relative to $V_{IN}$. In an embodiment, input stage 310 and output stage 320 provide a low power comparator. In an embodiment, input stage 310 includes an offset voltage circuit to provide an offset voltage such that a near decision is produced prior to producing the true decision relative to a ramping reference voltage. The near decision may be correlated to an output voltage $V_{NEAR}$ and the true decision may be correlated to an output voltage $V_{TRUE}$.

In an embodiment, output stage 320 includes logic circuitry 328 to output a control signal to reset input stage 310 once a voltage representing the true decision has been processed by the output stage 320. The control signal from logic circuitry 328 may reset a ramping signal used as $V_{REF}$ to an initial level. The control signal may also be used with other logic, depending on the application, to introduce a new input signal, $V_{IN}$. Additionally, logic circuitry 328 can power off output stage 320 once $V_{OUT}$ has been provided to circuits external to input stage 310 and output stage 320. In an embodiment, logic circuitry 328 closes a path to a voltage source that is opened by $V_{NEAR}$ at enable 322. In an embodiment, output stage 320 is configured to be powered up a fraction of a total ramp time of a ramping reference voltage. In an embodiment, output stage 320 is configured to be powered up for a time period ranging from about 10% to about 50% of a total ramp time of a ramping reference voltage.

In the embodiment of FIG. 4, a first differential pair (302, 311) includes transistor 302 as a driver with load transistor 304 forming an input section, such as input section 216 of FIG. 3, and transistor 311 as a driver with load transistor 313 forming a reference section, such as reference section 215 of FIG. 3. The second differential pair (306, 311) includes transistor 306 as a driver with load transistor 308 forming an input section, such as input section 218 of FIG. 3, with transistor 311 as a driver with load transistor 313 forming a reference section, such as reference section 215 of FIG. 3. The reference section is shared by each of the two differential pairs. Each transistor has an effective aspect ratio that can be referenced to a unit aspect ratio.

In embodiment configured as in FIG. 4, differential pair (302,311) are balanced. Driver transistors 302 and 311 and load transistors 304 and 313 are configured having equal threshold voltages, $V_{th}$, and the same aspect ratio, W/L, where W and L are the width and length for a transistor. Two transistors may be considered to have equal size when the two transistors have equal aspect ratios. Thus, transistors 302 and 311 have the same operating characteristics. With the load transistors 304, 313 having the same aspect ratio and the drive transistors having the same aspect ratio, $V_{TRUE}$ will switch when $V_{REF}=V_{IN}$. With the differential pair (311,306) unbalanced, where transistor 311 is larger size, that is, larger in aspect ratio than transistor 306 with load transistors 304, 311 configured to the same size, the output $V_{NEAR}$ will switch before $V_{TRUE}$ switches. The use of the two differential pairs (302, 311) and (306, 311) having a shared reference section effectively introduces an offset between the two differential pairs. In an embodiment for a comparator using the arrangement of FIG. 4, the shared, weighted input stage 310 allows a near and true decision to be made in which only two extra devices are required compared to a standard differential amplifier used for a comparator. The near decision may be used to enable a higher power, high speed output stage. Suitable logic can be incorporated with the output stage to reset the comparator once the true decision has been made. As a result, output stage 320 need be only powered on for a short time. In an embodiment, output stage 320 is only enabled for a time period that is a fraction of the total ramp time for a ramping voltage reference, $V_{REF}$. In an embodiment, output stage 320 is only enabled for a time period ranging from about 10% to about 50% of the total ramp time for a ramping voltage reference, $V_{REF}$.

In an embodiment, driver transistor 306 has an effective aspect ratio of one unit and driver transistors 302 and 311, each have an effective aspect ratio of N units, where N>1. With equal threshold voltages, $V_{th}$, and $V_{NEAR}$ switching when the drain to source current for transistor 311 equals the drain to source current for transistor 306, i.e., $I_{ds311}=I_{ds306}$, then $$\frac{NKW}{2L}(V_{gs311}-V_{th})^2 = \frac{KW}{2L}(V_{gs306}-V_{th})^2 \quad (1)$$

where K, W, and L are constant, transistor 311 having an aspect ratio of (N·W)/L and transistor 306 having an aspect ratio of W/L. Since K, W, and L are equal on both sides of equation (1), the introduced offset is equal to $N\cdot(V_{gs306}-V_{th})^2$. The $V_{NEAR}$ output may be used to power-up a high power, high speed output stage.

In an embodiment, transistor 302 is realized as multiple transistors in which each of the multiple transistors has an aspect ratio substantially equal to the aspect ratio of transistor 306. With transistor 302 configured as eight such transistors in parallel, transistor 302 has an effective aspect ratio that is eight times larger than the aspect ratio of transistor 306. In an embodiment, each of the multiple transistors forming transistor 302 are configured with the same width, W, and length, L, as transistor 306. Alternately, transistor 302 may be provided as a single transistor that is eight times larger in effective aspect ratio than transistor 306. Then, with $V_{IN}$ as a common input to transistors 302 and 306, each having a shared reference transistor 311 whose aspect ratio is equal to the effective aspect ratio of transistor 302, $V_{NEAR}$ from transistor 306 is provided to turn on a higher power output stage 320 before $V_{TRUE}$ flips. $V_{NEAR}$ is used to turn on the rest of the comparator that provides high speed and more gain, which limits the power consumption of the rest of the comparator to when $V_{NEAR}$ is provided.

In an embodiment, transistors 302 and 311 are realized as a number, N, of transistors, where each transistor is sized with the same aspect ratio as transistor 306. Alternately, transistor 302 is realized as N transistors, where each transistor is sized with the same aspect ratio as transistor 306, and transistor 311 is a single transistor having the same aspect ratio as the effective aspect ratio of transistor 302. In an embodiment, transistors 302 and 311 are single transistors having the same size and transistor 306 is 1/N the size of transistor 302. As a result, in each of these embodiments, the input section of input stage 310 having transistor 306 with $V_{NEAR}$ as an output is not balanced, or is unbalanced, compared with the reference section receiving a ramp voltage as an input reference. By using the different size aspect ratios for transistors 302, 311 relative to transistor 306 an effective offset is provided such that $V_{NEAR}$ will flip before $V_{TRUE}$ does, that is, it switches early as the ramp voltage, $V_{REF}$, increases.

In an embodiment, transistor 302 and transistor 311 each use sixteen transistors in parallel. Each of the sixteen transistors has an aspect ratio equal to that of transistor 306. The effective size of transistor 311, realized as 16 parallel transistors, is larger than the size of transistor 306. Then, the offset introduced would be 16 times the square of the difference between VGS and the threshold voltage as noted from equation (1). With a factor M representing the effective size of transistors 302 and 311 relative to transistor 306, embodiments for input stage 310 can be constructed with a design decision for switching by choosing the value of M. For example, M can be chosen with M=1, M=2.1, M=7, M=8, M=16, and other values. The choice of switching voltages can be based on several factors including application and manufacturing tolerances. For smaller M, the switching voltages may be too close such that any manufacturing tolerance in the transistors could affect the proper operation of the device. If the ratio, M, is too large, then $V_{NEAR}$ would flip too soon powering up output stage 320 for a longer fraction of the ramp signal. Then, output stage 320 would be on longer, consuming more power. Selection of M may also depend on how fast the reference ramp voltage sweeps and the input voltage range of the application. In an embodiment, choosing the parameters for input stage 310 for switching to be correlated to a fraction of the voltage swing of the reference ramp provides a means for the output stage to be on for that fraction of the ramp time. In an embodiment, choosing the parameters for input stage 310 for switching to be correlated from between about 10% to about 50% of the voltage swing of the reference ramp provides that the output stage is correspondingly on for between about 10% to about 50% of the ramp time.

When $V_{RAMP}$ increases, $V_{NEAR}$ switches before $V_{TRUE}$, and $V_{NEAR}$ turns on output stage 320. Then, $V_{TRUE}$, which is an input to output stage 320 and connected to the drain of transistor 306, will switch when the ramp voltage increases slightly further. Output stage 320 may be configured as a number of stages. To provide a high speed comparator, a number of output stages can be used to increase the gain. These output stages need not be powered up all of the operating time of electronic device 300. Thus, using $V_{NEAR}$ to control their power on allows these output stages to be powered up when the ramp is close to the input signal. In an embodiment, output stage 320 functions to increase the gain and/or output drive capability.

In an embodiment, transistors 302, 311 are configured with a selected size, aspect ratio, relative to transistor 306, and $V_{RAMP}$ is provided with a known ramping characteristics. When $V_{RAMP}$ ramps up to a predetermined value for switching voltage $V_{NEAR}$, $V_{NEAR}$ switches to enable output stage 320. Output stage 320 has an enable 322 coupled to output 316 of input stage 310 to receive $V_{NEAR}$. In an embodiment, output stage 320 toggles on when enable 322 receives the switching $V_{NEAR}$. In an embodiment, output stage 320 uses an edge sensitive enable 322 such that circuitry in output stage 320 powers up when $V_{NEAR}$ toggles. Then, when $V_{TRUE}$ toggles, a decision, $V_{OUT}$, is provided at output 326. Once the decision is provided at output 326, output stage 320 uses incorporated logic circuitry 328 to turn off. Thus, every time just before $V_{TRUE}$ is about to toggle, $V_{NEAR}$ toggles to enable output stage 320, and then, $V_{OUT}$ provides the decision of input stage 310 once $V_{TRUE}$ flips. Output stage 320 turns off after providing $V_{OUT}$.

In another embodiment, driver and load transistor pair (302,304) and driver and load transistor pair (306,308) are configured similarly except that the relative size, aspect ratio, of each driver transistor is unbalanced with respect to the other driver transistor. Additionally in this embodiment, driver 302 and driver 306 are both unbalanced with respect to driver 311 of the reference driver and load transistor pair (311,313). However, the components of driver and load transistor pair (302,304) and driver and load transistor pair (306, 308) are selected relative to the components of reference driver and load transistor pair (311,313) such that $V_{NEAR}$ output from driver and load transistor pair (306,308) switches before $V_{TRUE}$ is output from driver and load transistor pair (302,304) in response to a ramped $V_{REF}$. $V_{NEAR}$ is output when $V_{REF}$ is near in voltage level to $V_{IN}$, while $V_{TRUE}$ is output when $V_{REF}$ substantially equals $V_{IN}$. The amount of time at which $V_{NEAR}$ is output prior to $V_{TRUE}$ depends on the relative sizing of the components for input transistor pair (302,304) with respect to input transistor pair (306,308), and the ramp rate of $V_{REF}$.

Figure 5:
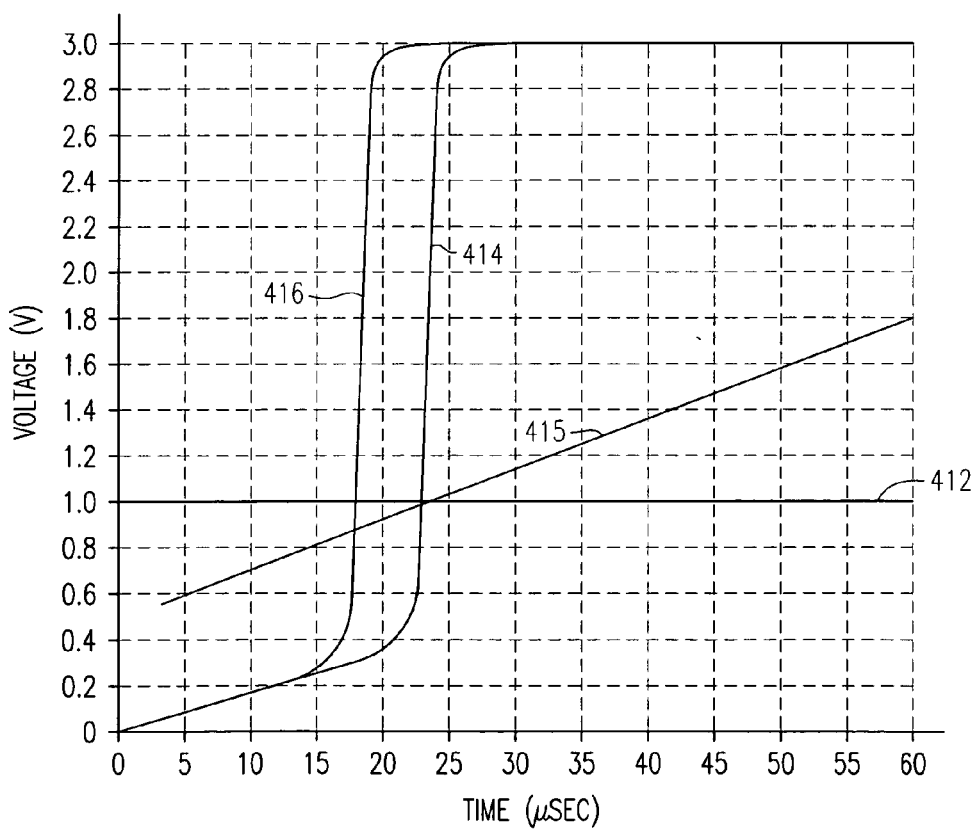
FIG. 5 illustrates simulation results for the schematic of the embodiment illustrated in FIG. 4 using HSPICE, according to the teachings of the present invention.

FIG. 5 illustrates simulation results for the schematic of the embodiment illustrated in FIG. 4 using HSPICE. In FIG. 5, a current source 330 in FIG. 4 of 1 μA is used for a $V_{IN}$ 412, where $V_{IN}$=1V. With N=8 in equation (1), $V_{TRUE}$ 414 switches when ramping reference voltage 415 substantially equals $V_{IN}$ 412, and $V_{NEAR}$ 416 switches prior to the time at which ramping reference voltage 415 substantially equals $V_{IN}$ 412. In an embodiment, $V_{NEAR}$ switches about 5 μsec before $V_{TRUE}$ switches.

The difference in the switching voltage between $V_{TRUE}$ 414 and $V_{NEAR}$ 416 may be different for process corners. Different process corners refer to processing parameters where for a given silicon process there would be a slow process, a fast process, or a combination process. These process corners relate to manufacturing intolerances. Measurements on a number or transistors, for example 1000 transistors, may be taken to determine how fast they were, where some would be slower, some will be faster. Often in designing circuits, different process corners are simulated. One process may be considered a slow process, SS, corresponding to a slow N-type transistor and a slow P-type transistor. A SF process would correspond to a slow N-type transistor and a fast P-type transistor, a FS process would correspond to a fast N-type transistor and a slow P-type transistor, and a FF process would correspond to a fast N-type transistor and a fast P-type transistor. The supply voltage and the temperature may also be varied. The following indicates the difference in the switching voltage (in mV) between $V_{TRUE}$ and $V_{NEAR}$ for different process, voltage, and temperature corners:

| SS | SF | FS | FF |
|---|---|---|---|
| 106 | 106 | 119 | 102 |

These parameters represent the process corners of manufacturing distributions. For example, if the speed of 1000 transistors were measured, a form of normal distribution Would be found, where some transistors would be faster and some would be slower. Then when simulating circuits, the simulation is performed with these compilations. As a result, there will be a transistor model for the slowest transistor and a transistor model for the fastest transistor of both the N-type and the P-type. The difference in switching voltage between $V_{NEAR}$ and $V_{TRUE}$ over these process corners is relatively constant, that is, the difference does not vary significantly. Thus, even with the use of different process parameters, a stable margin for turning off an output stage can be provided for various embodiments of input/output stages as discussed herein.

In an embodiment, electronic device 300 is an integrated circuit having a plurality of input and output stages. Each input stage is configured as input stage 310 and each output stage is configured as output stage 320 to provide an output, $V_{OUT}$, representative to the true signal, $V_{TRUE}$. The $V_{NEAR}$ signal is provided by each input stage to power up its corresponding output stage. In an embodiment, the integrated circuit is for an imaging chip.

Figure 6:
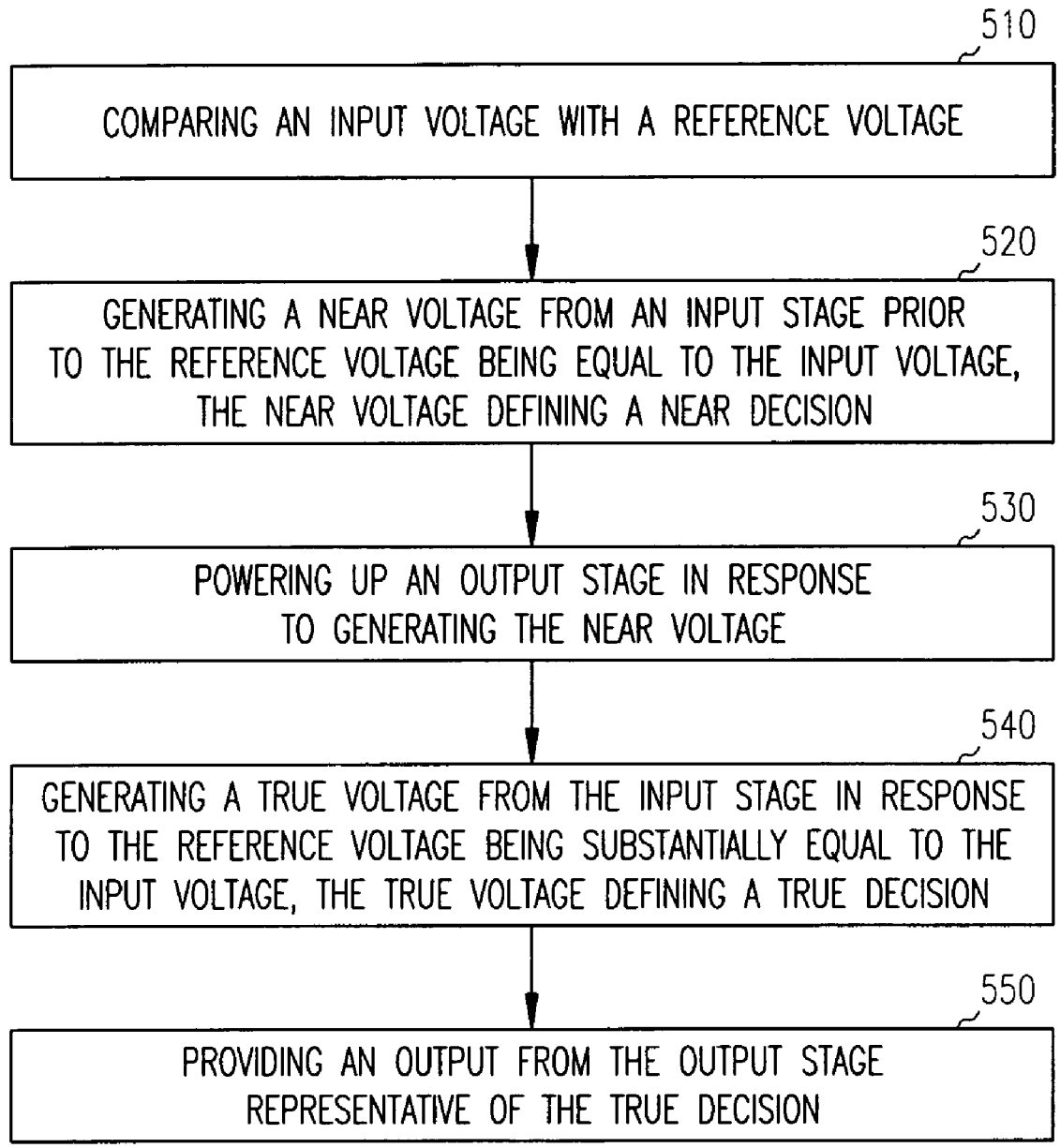
FIG. 6 illustrates an embodiment of a method of operating an electronic device having an input stage configured to provide a true voltage representing a comparison decision and a near voltage to power up an output stage to provide an output representative of the comparison decision, according to the teachings of the present invention.

FIG. 6 illustrates an embodiment of a method of operating an electronic device having an input stage configured to provide a true voltage representing a comparison decision and a near voltage to power up an output stage to provide an output representative of the comparison decision. The true voltage provides a true decision, while the near voltage defines a near decision. At 510, an input voltage is compared with a reference voltage. At 520, a near voltage is generated from the input stage prior to the reference voltage being substantially equal to the input voltage, where the near voltage defines a near decision. At 530, an output stage is powered up in response to generating the near voltage. At 540, a true voltage is generated from the input stage in response to the reference voltage being substantially equal to the input voltage, where the true voltage defines a true decision. At 550, an output is provided from the output stage representative of the true decision.

The reference voltage may be provided as a ramping voltage. The near voltage from the input stage is provided using an equivalent offset voltage such that the near decision is produced prior to producing the true decision relative to the ramping reference voltage. In an embodiment, the near voltage is generated from the input stage using two differential pairs receiving a common input signal and having a common reference section to receive the ramp voltage. The two differential pairs have input sections unbalanced with respect to each other, with one input section balanced with respect to the common reference section, to provide the effective offset. The near voltage may be provided as an enable input to the output stage. The input stage may be reset once a voltage representing the true decision has been processed by the output stage.

Figure 7:
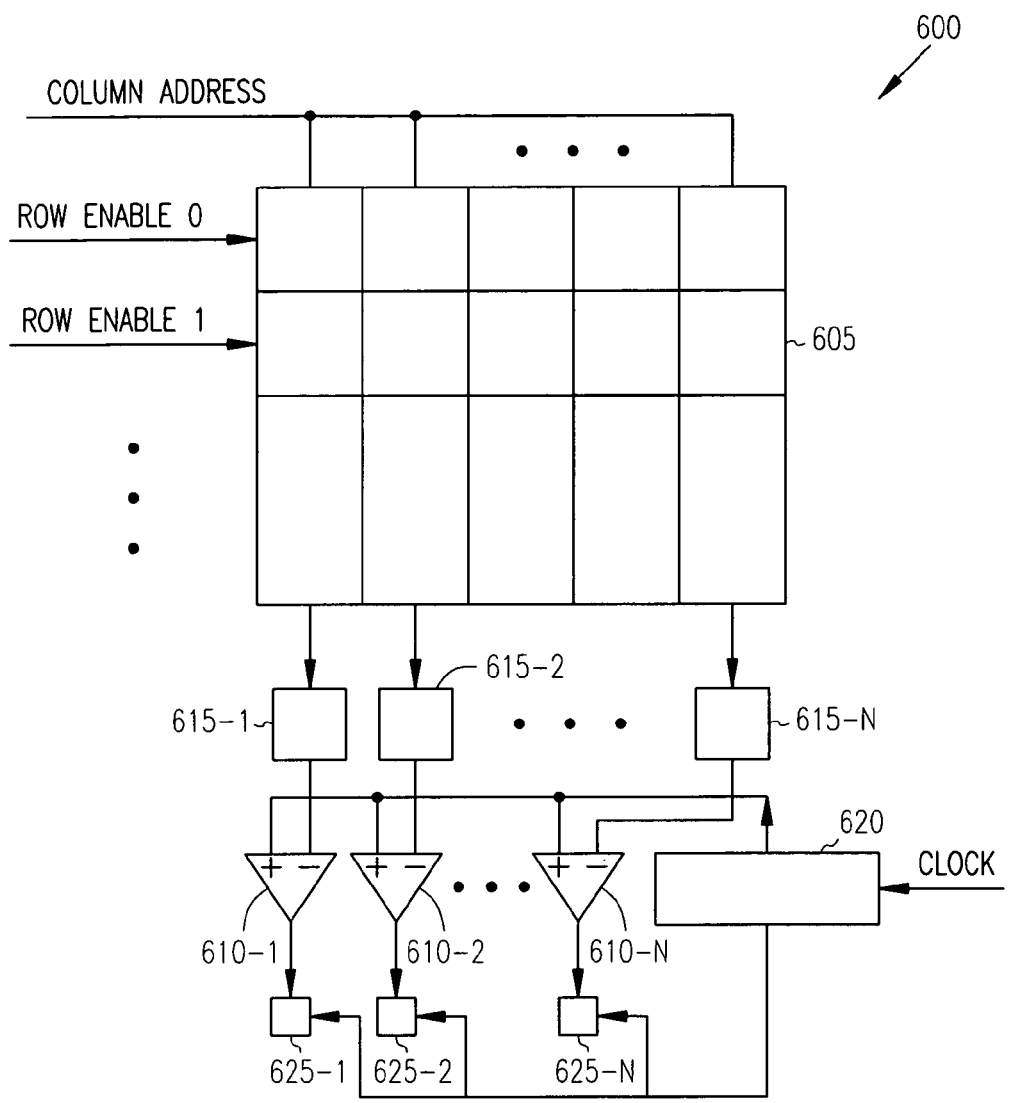
FIG. 7 depicts an embodiment of an electronic device having an imaging array that includes a pixel array and a number of comparators, where each comparator has an input stage that provides a decision output and an output to power up an output stage to provide a representation of the decision output, according to the teachings of the present invention.

FIG. 7 depicts an embodiment of an electronic device 600 having an imaging array that includes a pixel array 605 and a number of comparators 610-1, 610-2 . . . 610-N, where each comparator 610-1, 610-2 . . . 610-N has an input stage that provides a decision output and an output to power up an output stage to provide a representation of the decision output. In an embodiment, electronic device 600 includes a number of sample and holds 615-1 . . . 615-N, where each column of pixel array 605 is coupled to a sample and hold 615-1 . . . 615-N and each sample and hold 615-1 . . . 615-N is coupled to a comparator 610-1, 610-2 . . . 610-N to provide an input to the comparator to which it is coupled. A reference generator 620 provides a reference signal as another input to each comparator 610-1, 610-2 . . . 610-N. In an embodiment, reference generator 620 is realized as a single reference generator to provide a reference signal to all comparators 610-1, 610-2 . . . 610-N. An output of each comparator 610-1, 610-2 . . . 610-N is coupled to a corresponding latch 625-1 . . . 625-N to latch the value of the reference signal provided from reference generator to a comparator 610-1, 610-2 . . . 610-N, when the value of the reference signal substantially equals an input to a comparator 610-1, 610-2 . . . 610-N from a selected pixel of pixel array 605. In an embodiment, the latches 625-1 . . . 625-N may be configured to provide the signal as data to a memory such as a dynamic random access memory, DRAM.

Figure 8:
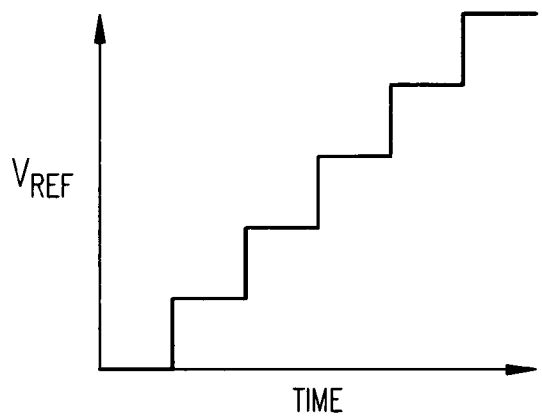
FIG. 8 shows an embodiment for a ramping reference voltage provided by the reference generator to the comparators illustrated in FIG. 7, according to the teachings of the present invention.

In an embodiment, reference generator 620 provides a ramping signal to comparators 610-1, 610-2 . . . 610-N. The ramping signal from reference generator 620 may be realized in various forms depending on the embodiment for a particular application. FIG. 8 shows an embodiment for a ramping reference voltage from reference generator 620 to comparators 610-1, 610-2 . . . 610-N. The ramping signal of FIG. 8 used as a reference signal may be provided from reference generator 620 as an analog ramp output that steps up as a staircase that increments on each clock cycle input to reference generator 620. Reference generator 620 may output to each latch 625-1 . . . 625-N a digital word that corresponds to a value of the ramp provided by reference generator 620, where the digital word is latched when the value of the ramp correlates to the voltage sampled by the corresponding sample and hold 615-1 . . . 615-N.

In an embodiment, electronic device 600 may be realized as a single chip. In an embodiment, electronic device 600 may be realized as a single imaging chip. Further, electronic device 600 may be an imaging device configured as an element of an electronic system having imaging functions.

Figure 9:
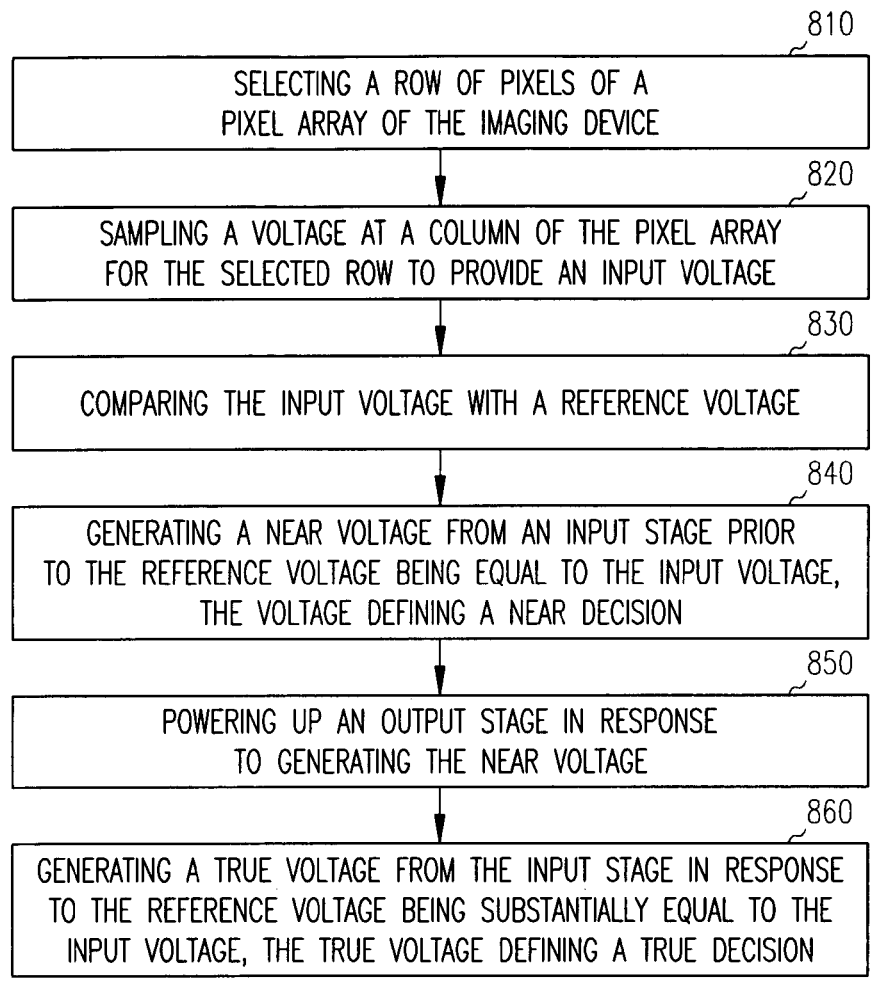
FIG. 9 illustrates an embodiment of a method for operating an imaging device that includes a pixel array that provides a signal to an input stage of a comparator configured to provide a true voltage representing a comparison decision and a near voltage to power up an output stage to provide an output representative of the comparison decision, according to the teachings of the present invention.

FIG. 9 illustrates an embodiment of a method for operating an imaging device that includes a pixel array that provides a signal to an input stage of a comparator configured to provide a true voltage representing a comparison decision and a near voltage to power up an output stage to provide an output representative of the comparison decision. The true voltage provides a true decision, while the near voltage defines a near decision. At 810, a row of pixels of a pixel array of the imaging device is selected. At 820, a voltage at a column of the pixel array for the selected row is sampled to provide an input voltage. At 830, the input voltage is compared with a reference voltage. At 840, at block 830, a near voltage is generated from an input stage prior to the reference voltage being equal to the input voltage, where the near voltage defines a near decision. At 850, an output stage is powered up in response to generating the near voltage. At 860, a true voltage is generated from the input stage in response to the reference voltage being substantially equal to the input voltage, where the true voltage defines a true decision.

The method of FIG. 9 may be applied to an embodiment for an electronic device as configured as in FIG. 7 using various embodiments for input and output stages for a comparator equivalent to the embodiment of FIG. 4. When a row of pixels is enabled, for each column that value stored in the pixel is provided to and stored on a sample and hold 615-1 . . . 615-N at the bottom of the column. In an embodiment where pixel array 605 is an array of 1000 pixels by 1000 pixels, N would be 1000 and enabling one row, row 0 for example, would store the value of those pixels in sample and holds 615-1 . . . 615-1000 at the bottom of the 1000 columns. Once all the values have been stored in sample and holds 615-1 . . . 615-1000, the output of each sample and hold 615-1 . . . 615-1000 is provided as one input to a comparator 610-1 . . . 610-1000, such that each sample and hold 615-1 . . . 615-1000 is coupled to an individual comparator 610-1 . . . 610-1000. The signal from the sample and holds 615-1 . . . 615-N is the $V_{IN}$ for comparators 610-1 . . . 610-1000 configured equivalent to the input/output stages of FIG. 4. The other input to comparators 610-1 . . . 610-1000 are all joined together to a common reference generator 620 that provides a ramp. The ramp provides $V_{REF}$ of FIG. 4. This ramp may be configured in a counting mode. For example, the ramp may be a 10 bit ramp, providing 1,024 steps between about 0 and about 1 volt. Thus, each step will be incremented by $\frac{1}{1024}$ volt over the previous step. As this ramp moves up, which is always increasing, that is monotonically increasing, in this embodiment, each comparator 610-1 . . . 610-1000 will switch when the ramp input to that comparator signal equals its sampled input. Every time a comparator 610-1 . . . 610-1000 switches, the value of the ramp is stored. Additionally, an extra ramp value can be stored so there will be a counter for ramp generator 620. The value of the ramp is stored as a word representing 1000 analog to digital converters.

In an embodiment, a common ramp is used as an input to all comparators. In an embodiment, the ramp value is stored in latch 625 for a particular column for the selected row by addressing that column. When one particular comparator flips corresponding to the addressed column, a word is latched, where that word provides the state of the ramp for that particular column. Each latch 625-1 ... 625-N may be enabled by a $V_{OUT}$ of FIG. 4 of a corresponding comparator 610-1 ... 610-N. In this embodiment for an architecture, a slope ADC is provided at each column. In an embodiment, reference generator 620 is realized as a single ramp generator for the entire imaging device with a comparator configured in an equivalent embodiment to the comparator discussed with respect to FIG. 4. Such a comparator generates both a near decision and a true decision from an input stage using an offset voltage such that the near decision is produced prior to producing the true decision relative to the ramping reference voltage. With the offset set that to zero, when $V_{IN}$ equals $V_{RAMP}$ the comparator will flip for both the near decision and the true decision.

In an embodiment, a near voltage, $V_{NEAR}$, representing a near decision, is generated from an input stage prior to generating a true voltage, representing a true decision, using two differential pairs receiving a common input signal and having a common reference section to receive the ramp voltage. The two differential pairs have input sections unbalanced with respect to each other, where one input section is balanced with respect to the common reference section. $V_{NEAR}$ is provided as an enable input to the output stage. The input stage for the comparator is reset once a voltage representing the true decision has been processed by the output stage.

Figure 10:
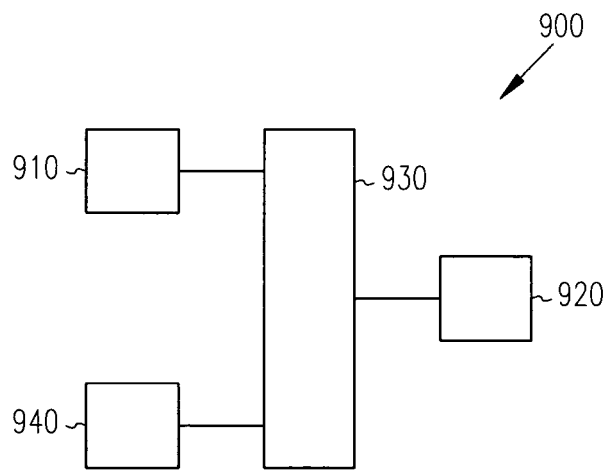
FIG. 10 illustrates an embodiment of an electronic system having an electronic device that includes a comparator having an input stage to produce a near decision and a true decision, according to the teachings of the present invention.

FIG. 10 illustrates an embodiment of an electronic system 900 having a processor 910 coupled to an electronic device 920 that includes a comparator having an input stage to produce a near decision and a true decision, where the near decision is provided to power up a switching output stage for the comparator to provide an output representative of the true decision. In an embodiment, electronic system 900 includes a bus 930 for inter-communication to which processor 910, electronic device 920, and other peripheral devices 940 are coupled. In an embodiment, electronic device 920 is an imaging device. Peripheral devices 940 may include memory, other processing units, or system input/output devices. Electronic device 920 may be realized as an equivalent embodiment of electronic device 600 of FIG. 7 including a comparator having an input stage configured in an embodiment equivalent to the input stage of FIGS. 2, 3, or 4. Electronic system 900 may be realized as, but is not limited to, an information handling device or a computer.

An input stage for a comparator as discussed herein may be realized in various embodiments that provide a true decision and a near decision in which the near decision is used to enable an output stage to power on. The output stage supplies gain and various processing to the true decision from the input stage to provide a representation of the true decision. By powering the output stage on for only a fraction of a ramping reference voltage to the input stage, such an input/output stage configuration provides for lowered power consumption while still maintaining high speed of operation.

Although specific embodiments have been illustrated and described herein, it will be appreciated by those of ordinary skill in the art that any arrangement that is calculated to achieve the same purpose may be substituted for the specific embodiments shown. This application is intended to cover any adaptations or variations of the present invention. It is to be understood that the above description is intended to be illustrative, and not restrictive. Combinations of the above embodiments, and other embodiments, will be apparent to those of skill in the art upon reviewing the above description. The scope of the present invention includes any other applications in which the above structures and fabrication methods are used. The scope of the present invention should be determined with reference to the appended claims, along with the full scope of equivalents to which such claims are entitled.

What is claimed is:

1. An electronic device comprising:
an input stage of a comparator to produce a near decision and a true decision, the near decision to power up a switching output stage for the comparator to provide an output representative of the true decision, wherein the input stage includes an offset voltage circuit to provide an offset voltage such that the near decision is produced prior to producing the true decision relative to a ramping reference voltage.

2. The electronic device of claim 1, further including the switching output stage having an enable input responsive to a voltage representative of the near decision.

3. The electronic device of claim 1, further including the switching output stage having logic circuitry to reset the input stage once a voltage representing the true decision has been processed by the switching output stage.

4. An electronic device comprising:
an input stage of a comparator to produce a near decision and a true decision, the near decision to power up a switching output stage for the comparator to provide an output representative of the true decision, the switching output stage configured to be powered up for a time period set at a fraction of a total ramp time of a ramping reference voltage.

5. The electronic device of claim 4, wherein the time period ranges from about 10% to about 50% of the total ramp time of the ramping reference voltage.

6. The electronic device of claim 4, wherein the electronic device is configured as a single chip.

7. An electronic device comprising:
a first differential pair of an input stage, the first differential pair having a first input section responsive to an input signal and a reference section responsive to a reference signal, the first input section balanced with respect to the reference section; and
a second differential pair of the input stage, the second differential pair including the reference section of the first differential pair and a second input section responsive to the input signal, the second input section unbalanced with respect to the reference section, wherein the second differential pair provides a near decision and the first differential pair provides a true decision, the near decision to power up a switching output stage to provide an output representative of the true decision.

8. The electronic device of claim 7, wherein the first input section has a first driver transistor and a first load transistor and the second input section has a second driver transistor and a second load transistor, the first load transistor and the second load transistor having equal aspect ratios, the first driver transistor having an aspect ratio larger than that of the second driver transistor.

9. The electronic device of claim 7, wherein the first input section includes multiple transistors in parallel to receive an input signal and the second input section has a number of transistors in parallel to receive the input signal, the multiple transistors of the first input section having an effective aspect ratio larger than that of the number of transistors of the second input section.

10. The electronic device of claim 7, wherein the number of transistors of the second input section is one.

11. The electronic device of claim 7, further including the switching output stage having logic circuitry to reset the input stage once a voltage representing the true decision has been processed by the switching output stage.

12. The electronic device of claim 7, further including the switching output stage configured to be powered up for a time period set at a fraction of a total ramp time of a ramping reference voltage.

13. The electronic device of claim 7, further including the switching output stage configured to be powered up for a time period ranging from about 10% to about 50% of a total ramp time of a ramping reference voltage.

14. An integrated circuit comprising:
a switching output stage;
an input stage of a comparator to provide a near decision and a true decision to the switching output stage, the near decision to power up the switching output stage to provide an output representative of the true decision, wherein the input stage includes an offset voltage circuit to provide an offset voltage such that the near decision is produced prior to producing the true decision relative to a ramping reference voltage.

15. The integrated circuit of claim 14, wherein the switching output stage includes an enable input responsive to a voltage representative of the near decision.

16. The integrated circuit of claim 14, wherein the switching output stage includes logic circuitry to reset the input stage once a voltage representing the true decision has been processed by the switching output stage.

17. The integrated circuit of claim 14, further including:
a plurality of switching output stages; and
a plurality of input stages for comparators, each input stage to produce a near decision and a true decision, the near decision to power up one of the switching output stages to provide an output representative of the true decision.

18. The integrated circuit of claim 14, wherein the integrated circuit is an imaging chip.

19. An integrated circuit comprising:
a switching output stage;
an input stage of a comparator to provide a near decision and a true decision to the switching output stage, the near decision to power up the switching output stage to provide an output representative of the true decision, the switching output stage configured to be powered up for a time period set at a fraction of a total ramp time of a ramping reference voltage.

20. The integrated circuit of claim 19, wherein the time period ranges from about 10% to about 50% of the total ramp time of the ramping reference voltage.

21. An integrated circuit comprising:
a switching output stage;
an input stage of a comparator to provide a near decision and a true decision to the switching output stage, the near decision to power up the switching output stage to provide an output representative of the true decision;
a plurality of switching output stages; and
a plurality of input stages for comparators, each input stage to produce a near decision and a true decision, the near decision to power up one of the switching output stages to provide an output representative of the true decision, wherein the input stage includes a first differential transistor pair to produce the near decision and a second differential transistor pair to produce the true decision, the first differential transistor pair offset from the second differential pair to provide the near decision before the second differential pair provides the true decision in response to a ramping reference signal becoming substantially equal to an input signal to the first and second differential pairs.

22. An imaging device comprising:
a pixel array having multiple rows and multiple columns;
a number of sample and hold units, each sample and hold unit coupled to a separate column of the pixel array;
a number of comparators, each comparator coupled to a separate sample and hold unit, each comparator including an input stage and an output stage, the input stage to produce a near decision and a true decision, the near decision to power up the output stage to provide an output representative of the true decision, wherein each input stage includes an offset voltage circuit to provide an offset voltage such that the near decision is produced prior to producing the true decision relative to a ramping reference voltage.

23. The imaging device of claim 22, further including a latch coupled to a comparator to capture a word representing a value of a ramping voltage.

24. The imaging device of claim 22, wherein the output stage includes an enable input responsive to a voltage representative of the near decision.

25. The imaging device of claim 22, wherein the output stage includes logic circuitry to reset the input stage once a voltage representing the true decision has been processed by the switching output stage.

26. An imaging device comprising:
a pixel array having multiple rows and multiple columns;
a number of sample and hold units, each sample and hold unit coupled to a separate column of the pixel array;
a number of comparators, each comparator coupled to a separate sample and hold unit, each comparator including an in put stage and an output stage, the input stage to produce a near decision and a true decision, the near decision to power up the output stage to provide an output representative of the true decision, wherein each comparator includes a first differential pair having a first input section to receive an input signal from a sample and hold unit at a first transistor group and a reference section to receive a reference input and a second differential pair having the reference section to receive the reference input and a second input section to receive the input signal from the sample and hold unit at a second transistor group, the first transistor group having an effective aspect ratio larger than that of the second transistor group.

27. The imaging device of claim 26, wherein the first input section has a first driver transistor and a first load transistor and the second input section has a second driver transistor and a second load transistor, the first load transistor and the second load transistor having equal aspect ratios, the first driver transistor having an aspect ratio larger than that of the second driver transistor.

28. An imaging device comprising:
a pixel array having multiple rows and multiple columns;
a number of sample and hold units, each sample and hold unit coupled to a separate column of the pixel array;
a number of comparators, each comparator coupled to a separate sample and hold unit, each comparator including an input stage and an output stage, the input stage to produce a near decision and a true decision, the near decision to power up the output stage to provide an output representative of the true decision, wherein the output stage is configured to be powered up for a time period set at a fraction of a total ramp time of a ramping reference voltage.

29. has been amended as follows The imaging device of claim 28, wherein the time period ranges from about 10% to about 50% of the total ramp time of the ramping reference voltage.

30. A system comprising:
a processor; and
an imaging device coupled to the processor, the imaging device including:
a pixel array having a number of rows and a number of columns;
a number of sample and hold units, the number equal to the number of columns of the pixel array, each sample and hold unit coupled to a separate column of the pixel array;
a number of comparators, each comparator coupled to a separate sample and hold unit of the number of sample and hold units; each comparator including an input stage to produce a near decision and a true decision, the near decision to power up a switching output stage to provide an output representative of the true decision, wherein the input stage includes an offset voltage circuit to provide an offset voltage such that the near decision is produced prior to producing the true decision relative to a ramping reference voltage.

31. The system of claim 30, further including a latch responsive coupled to a comparator to capture a word representing a value of a ramp generator, the ramp generator providing a ramping voltage as a reference voltage to the number of comparators.

32. The system of claim 31, further including memory to store the captured word representative of the value of the ramp generator.

33. The system of claim 30, further including the switching output stage having an enable input responsive to a voltage representative of the near decision.

34. The system of claim 30, further including the switching output stage having logic circuitry to reset the input stage once a voltage representing the true decision has been processed by the switching output stage.

35. A system comprising:
a processor; and
an imaging device coupled to the processor, the imaging device including:
a pixel array having a number of rows and a number of columns;
a number of sample and hold units, the number equal to the number of columns of the pixel array, each sample and hold unit coupled to a separate column of the pixel array;
a number of comparators, each comparator coupled to a separate sample and hold unit of the number of sample and hold units; each comparator including an input stage to produce a near decision and a true decision, the near decision to power up a switching output stage to provide an output representative of the true decision, wherein each comparator includes a first differential pair having a first input section to receive an input signal from a sample and hold unit at a first transistor group and a reference section to receive a reference input and a second differential pair having the reference section to receive the reference input and a second input section to receive the input signal from the sample and hold unit at a second transistor group, the first transistor group larger in effective size than the second transistor group.

36. A method for forming an electronic device comprising:
providing an input stage of a comparator configured to produce a near decision and a true decision, and
coupling the input stage to a switching output stage such that the near decision operatively powers up the switching output stage to provide an output representative of the true decision, wherein providing an input stage includes providing the input stage with a circuit to provide an offset voltage such that the near decision is produced prior to producing the true decision relative to a ramping reference voltage.

37. The method of claim 36, wherein coupling the input stage to a switching output stage includes coupling the input stage to a switching output stage having an enable input responsive to a voltage representative of the near decision.

38. The method of claim 36, wherein coupling the input stage to a switching output stage includes coupling the input stage to a switching output stage having logic circuitry to reset the input stage once a voltage representing the true decision has been processed by the switching output stage.

39. The method of claim 36, wherein the method further includes coupling a ramp generator to the input stage.

40. The method of claim 36, wherein forming an electronic device includes forming the electronic device as a single chip.

41. A method for forming an electronic device comprising:
providing an input stage of a comparator configured to produce a near decision and a true decision,
coupling the input stage to a switching output stage such that the near decision operatively powers up the switching output stage to provide an output representative of the true decision; and
coupling a ramp generator to each input stage and configuring the switching output stage with logic circuitry such that the switching output stage is powered up for a time period set at a fraction of a total ramp time of a ramping reference voltage.

42. The method of claim 41, wherein the time period ranges from about 10% to about 50% of the total ramp time of the ramping reference voltage.

43. A method for forming an imaging device comprising:
providing a pixel array, the pixel array having a number of rows and a number of columns;
coupling a number of sample and hold units to the pixel array;
coupling a number of comparators to the number of sample and hold units, each comparator coupled to a different one of the number of sample and hold units, each comparator provided by
providing an input stage configured to produce a near decision and a true decision, and
coupling the input stage to a switching output stage such that the near decision operatively powers up the switching output stage to provide an output representative of the true decision, wherein providing an input stage includes providing the input stage with a circuit to provide an offset voltage such that the near decision is produced prior to producing the true decision relative to a ramping reference voltage.

44. The method of claim 43, wherein coupling the input stage to a switching output stage includes coupling the input stage to a switching output stage having an enable input responsive to a voltage representative of the near decision.

45. The method of claim 43, wherein coupling the input stage to a switching output stage includes coupling the input stage to a switching output stage having logic circuitry to reset the input stage once a voltage representing the true decision has been processed by the switching output stage.

46. The method of claim 43, wherein the method further includes coupling a ramp generator to each input stage.

47. The method of claim 43, wherein forming an imaging device includes forming the electronic device as an imaging chip.

48. A method for forming an imaging device comprising:
providing a pixel array, the pixel array having a number of rows and a number of columns;
coupling a number of sample and hold units to the pixel array;
coupling a number of comparators to the number of sample and hold units, each comparator coupled to a different one of the number of sample and hold units, each comparator provided by
providing an input stage configured to produce a near decision and a true decision, and
coupling the input stage to a switching output stage such that the near decision operatively powers up the switching output stage to provide an output representative of the true decision, wherein providing an input stage configured to produce a near decision and a true decision includes:
providing a first differential pair having a first input section to receive an input signal from a sample and hold unit at a first transistor group and a reference section to receive a reference input; and
providing a second differential pair having the reference section to receive the reference input and a second input section to receive the input signal from the sample and hold unit at a second transistor group, the first transistor group larger in effective size than the second transistor group.

49. A method for forming an imaging device comprising:
providing a pixel array, the pixel array having a number of rows and a number of columns;
coupling a number of sample and hold units to the pixel array;
coupling a number of comparators to the number of sample and hold units, each comparator coupled to a different one of the number of sample and hold units, each comparator provided by
providing an input stage configured to produce a near decision and a true decision, and
coupling the input stage to a switching output stage such that the near decision operatively powers up the switching output stage to provide an output representative of the true decision, wherein the method further includes coupling a ramp generator to each input stage and configuring the switching output stage with logic circuitry such that the switching output stage is powered up for a time period set at a fraction of a total ramp time of a ramping reference voltage.

50. The method of claim 49, wherein the time period ranges from about 10% to about 50% of the total ramp time of the ramping reference voltage.

51. A method for forming an electronic system comprising:
providing a processor;
coupling a pixel array to the processor; and
coupling the pixel array to a number of comparators, each comparator having an input stage configured to produce a near decision and a true decision such that the near decision operatively powers up an output stage to provide an output representative of the true decision, wherein coupling the pixel array to a number of comparators includes coupling the pixel array to a number of comparators with each comparator having an input stage including a circuit to provide an offset voltage such that the near decision is produced prior to producing the true decision relative to a ramping reference voltage.

52. The method of claim 51, wherein the method further includes, for each comparator, coupling the input stage to an output stage having an enable input responsive to a voltage representative of the near decision.

53. The method of claim 51, wherein the method further includes, for each comparator, coupling the input stage to an output stage having logic circuitry to reset the input stage once a voltage representing the true decision has been processed by the switching output stage.

54. A method for forming an electronic system comprising:
providing a processor;
coupling a pixel array to the processor; and
coupling the pixel array to a number of comparators, each comparator having an input stage configured to produce a near decision and a true decision such that the near decision operatively powers up an output stage to provide an output representative of the true decision;
for each comparator, coupling the input stage to an output stage having logic circuitry to reset the input stage once a voltage representing the true decision has been processed by the switching output stage; and
coupling a ramp generator to the input stage of each comparator and configuring the logic circuitry of the output stage such that the output stage is powered up for a time period set at a fraction of a total ramp time of a ramping reference voltage.

55. The method of claim 54, wherein the time period ranges from about 10% to about 50% of the total ramp time of the ramping reference voltage.

56. A method of operating an electronic device comprising:
comparing an input voltage with a reference voltage in an input stage;
generating a near voltage from the input stage prior to the reference voltage being equal to the input voltage, the near voltage defining a near decision;
powering up an output stage in response to generating the near voltage;
generating a true voltage from the input stage in response to the reference voltage being substantially equal to the input voltage, the true voltage defining a true decision; and
providing an output from the output stage representative of the true decision.

57. The method of claim 56, wherein the method further includes providing the reference voltage as a ramping voltage.

58. The method of claim 56, wherein generating a near voltage from an input stage includes using an offset voltage such that the near decision is produced prior to producing the true decision relative to a ramping reference voltage.

59. The method of claim 56, wherein generating a near voltage from an input stage includes generating the near voltage from two differential pairs receiving a common input signal, having a common reference section to receive the reference voltage, and having input sections unbalanced with respect to each other where one section is balanced with respect to the common reference section, such that the near decision is produced prior to producing the true decision relative to a ramping reference voltage.

60. The method of claim 56, wherein the method further includes providing the near voltage as an enable input to the output stage.

61. The method of claim 56, wherein the method further includes resetting the input stage once a voltage representing the true decision has been processed by the output stage.

62. A method of operating an imaging device comprising:

selecting a row of pixels of a pixel array of the imaging device;

sampling a voltage at a column of the pixel array for the selected row to provide an input voltage;

comparing the input voltage with a reference voltage in the input stage;

generating a near voltage from the input stage prior to the reference voltage being equal to the input voltage, the near voltage defining a near decision;

powering up an output stage in response to generating the near voltage; and generating a true voltage from the input stage in response to the reference voltage being substantially equal to the input voltage, the true voltage defining a true decision.

63. The method of claim 62, wherein the method further includes providing the reference voltage as a ramping voltage.

64. The method of claim 62, wherein generating a near voltage from an input stage includes using an offset voltage such that the near decision is produced prior to producing the true decision relative to a ramping reference voltage.

65. The method of claim 62, wherein generating a near voltage from an input stage includes generating the near voltage from two differential pairs receiving a common input signal, having a common reference section to receive the reference voltage, and having input sections unbalanced with respect to each other where one input section is balanced with respect to the common reference section, such that the near decision is produced prior to producing the true decision relative to a ramping reference voltage.

66. The method of claim 62, wherein the method further includes providing the near voltage as an enable input to the output stage.

67. The method of claim 62, wherein the method further includes resetting the input stage once a voltage representing the true decision has been processed by the output stage.

68. A method of operating an electronic system comprising:

addressing a column of a pixel array;

selecting a row of the pixel array;

comparing an input voltage provided from the addressed column of the selected row of pixels with a reference voltage in an input stage;

generating a near voltage from the input stage prior to the reference voltage being equal to the input voltage, the near voltage defining a near decision; and powering up an output stage in response to generating the near voltage;

generating a true voltage from the input stage in response to the reference voltage being substantially equal to the input voltage, the true voltage defining a true decision; and latching a word representing the true voltage; and providing the word to a system unit external to the pixel array.

69. The method of claim 68, wherein the method further includes providing the reference voltage as a ramping voltage.

70. The method of claim 68, wherein generating a near voltage from an input stage includes using an offset voltage such that the near decision is produced prior to producing the true decision relative to a ramping reference voltage.

71. The method of claim 68, wherein generating a near voltage from an input stage includes generating the near voltage from two differential pairs receiving a common input signal, having a common reference section to receive the reference voltage, and having input sections unbalanced with respect to each other where one input section is balanced with respect to the common reference section, such that the near decision is produced prior to producing the true decision relative to a ramping reference voltage.

72. The method of claim 68, wherein the method further includes providing the near voltage as an enable input to the output stage.

73. The method of claim 68, wherein the method further includes resetting the input stage once a voltage representing the true decision has been processed by the output stage.

74. The method of claim 68, wherein providing the word to a system unit external to the pixel array includes providing the word to a memory of the system.

* * * * *

UNITED STATES PATENT AND TRADEMARK OFFICE
CERTIFICATE OF CORRECTION

| | | |
|---|---|---|
| PATENT NO. | : 7,612,816 B2 | Page 1 of 1 |
| APPLICATION NO. | : 10/854775 | |
| DATED | : November 3, 2009 | |
| INVENTOR(S) | : Philip Neaves | |

It is certified that error appears in the above-identified patent and that said Letters Patent is hereby corrected as shown below:

In column 14, line 34, in Claim 26, delete "in put" and insert -- input --, therefor.

In column 15, line 1, in Claim 29, delete "has been amended as follows The" and insert -- The --, therefor.

Signed and Sealed this

Fifth Day of January, 2010

David J. Kappos
*Director of the United States Patent and Trademark Office*

UNITED STATES PATENT AND TRADEMARK OFFICE
CERTIFICATE OF CORRECTION

PATENT NO.        : 7,612,816 B2                                Page 1 of 1
APPLICATION NO.   : 10/854775
DATED             : November 3, 2009
INVENTOR(S)       : Philip Neaves It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1561 days.

Signed and Sealed this

Nineteenth Day of October, 2010

David J. Kappos
*Director of the United States Patent and Trademark Office*